US008040740B2

(12) United States Patent  
Momma

(10) Patent No.: US 8,040,740 B2  
(45) Date of Patent: Oct. 18, 2011

(54) SEMICONDUCTOR DEVICE WITH OUTPUT BUFFER CONTROL CIRCUIT FOR SEQUENTIALLY SELECTING LATCHED DATA

(75) Inventor: Atsuko Momma, Chuo-ku (JP)

(73) Assignee: Elpida Memory, Inc., Tokyo (JP)

( * ) Notice: Subject to any disclaimer, the term of this patent is extended or adjusted under 35 U.S.C. 154(b) by 38 days.

(21) Appl. No.: 12/606,742

(22) Filed: Oct. 27, 2009

(65) Prior Publication Data

US 2010/0110802 A1    May 6, 2010

(30) Foreign Application Priority Data

Oct. 30, 2008    (JP) .................................. 2008-280106

(51) Int. Cl.  
*G11C 7/00* (2006.01)

(52) U.S. Cl. .................. 365/189.05; 365/233.1; 365/219

(58) Field of Classification Search ............. 365/189.05, 365/233.1, 219  
See application file for complete search history.

(56) References Cited

U.S. PATENT DOCUMENTS

| 5,197,101 | A  | * | 3/1993  | Mok ............................... 704/500 |
| 6,189,121 | B1 | * | 2/2001  | Ogawa .......................... 714/733 |
| 6,421,797 | B1 |   | 7/2002  | Kim |
| 7,058,863 | B2 | * | 6/2006  | Kouchi et al. ................. 714/718 |
| 7,814,381 | B2 | * | 10/2010 | Ozeki ........................... 714/719 |

FOREIGN PATENT DOCUMENTS

| JP | 2000-011695 A | 1/2000 |
| JP | 2001-338953 A | 12/2001 |

* cited by examiner

*Primary Examiner* — Connie Yoha  
(74) *Attorney, Agent, or Firm* — Sughrue Mion, PLLC

(57) ABSTRACT

A semiconductor device includes a data compression circuit that performs sequential processes based on timings of an external clock signal. The sequential processes include compressing data input in parallel, latching the compressed data, and outputting the latched data.

20 Claims, 7 Drawing Sheets

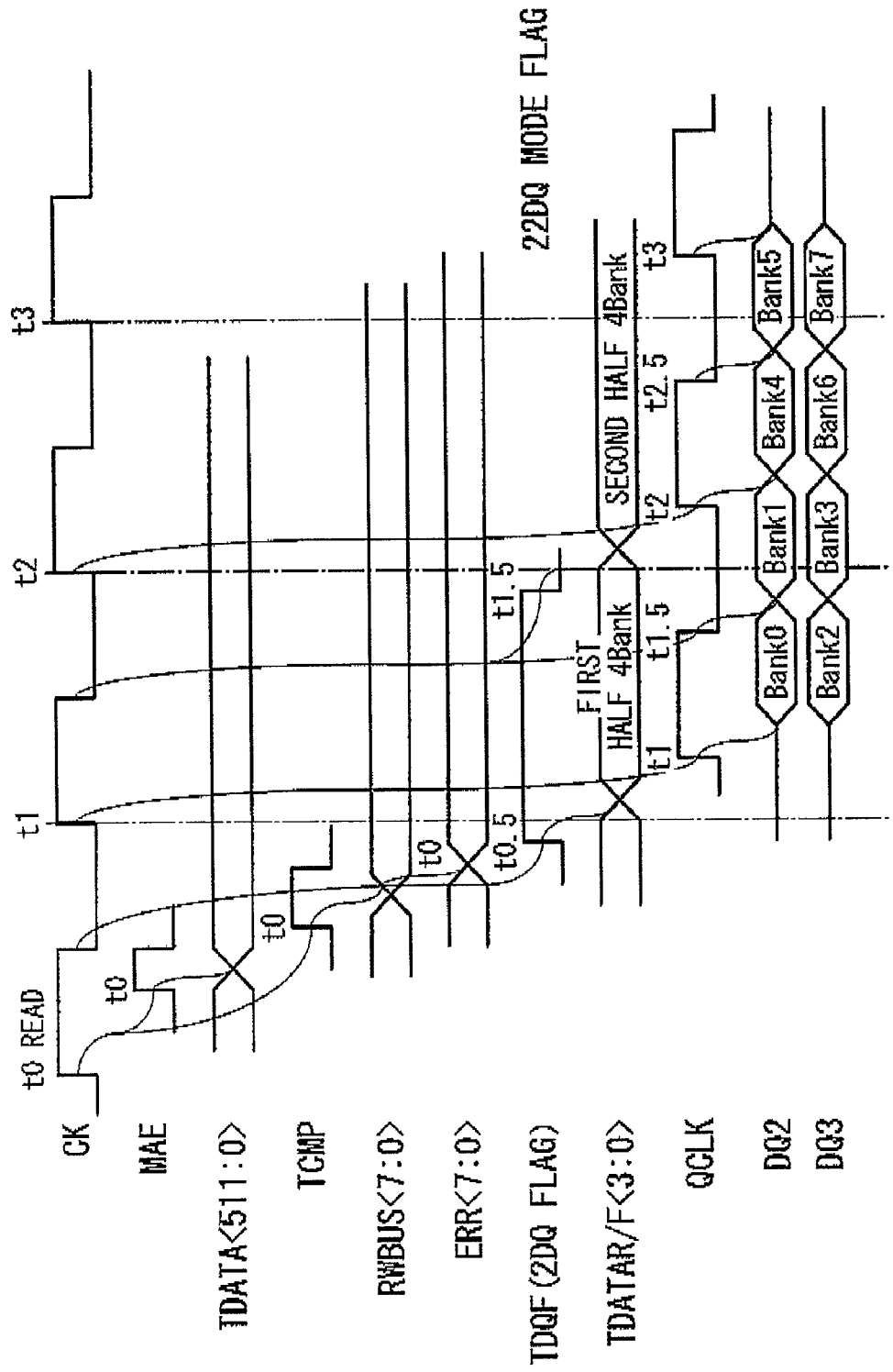

SEMICONDUCTOR DEVICE WITH OUTPUT BUFFER CONTROL CIRCUIT FOR SEQUENTIALLY SELECTING LATCHED DATA

BACKGROUND OF THE INVENTION

1. Field of the Invention

The present invention generally relates to a semiconductor device. More specifically, the present invention relates to a semiconductor memory device such as a dynamic random access memory which is hereinafter refereed to as a DRAM.

Priority is claimed on Japanese Patent Application No. 2008-280106, filed Oct. 30, 2008, the content of which is incorporated herein by reference.

2. Description of the Related Art

In recent years, semiconductor memory devices such as DRAMs have been increasing in its capacity, while increasing the cost for testing wafer. There are techniques to avoid the increase in the cost for testing wafer. Japanese Unexamined Patent Application, First Publication, No. JP-A-2001-338953 discloses a technique for avoiding the increase in the cost for testing wafer, wherein a plurality of chips is measured at the same time. Japanese Unexamined Patent Application, First Publication, No. JP-A-2000-11695 discloses a parallel test technique that compresses a plurality of bits into one bit and outputs the compressed bit to the outside of a chip in order to reduce the test time.

SUMMARY

In one embodiment, a semiconductor device may include, but is not limited to, a data compression circuit that performs sequential processes based on timings of an external cloak signal. The sequential processes may include, but is not limited to, compressing data input in parallel, latching the compressed data, and outputting the latched data.

In another embodiment, a semiconductor device may include, but is not limited to, a plurality of memory cells, a first compression circuit, a latch circuit, and an output buffer circuit. The first compression circuit receives a plurality of data that are input in parallel from the plurality of memory cells. The first compression circuit compresses data in synchronization with a first transition of an external clock signal. The data have been read out of the plurality of memory cells. The latch circuit receives the first compressed data from the first compression circuit. The latch circuit latches the first compressed data based on a first control signal. The first control signal is synchronized with a second transition of the external clock signal. The output buffer circuit receives first latched data from the latch circuit. The output buffer circuit outputs the first latched data based on a second control signal. The second control signal is synchronized with a third transition of the external clock signal.

In still another embodiment, a circuit may include, but is not limited to, a first compression circuit, a latch circuit, and an output buffer circuit. The first compression circuit compresses data in synchronization with a first transition of an external clock signal. The latch circuit receives first compressed data from the first compression circuit. The latch circuit latches the first compressed data in synchronization with a second transition of the external clock signal. The output buffer circuit receives the first latched data from the latch circuit. The output buffer circuit outputs the latched data in synchronization with a third transition of the external clock signal. The circuit may further include, but is not limited to, a second compression circuit that compresses data in synchronization with the first transition of the external clock signal. The latch circuit receives second compressed data from the second compression circuit, the latch circuit latching the second compressed data in synchronization with the second transition of the external clock signal.

BRIEF DESCRIPTION OF THE DRAWINGS

The above features and advantages of the present invention will be more apparent from the following description of certain preferred embodiments taken in conjunction with the accompanying drawings, in which:

FIG. 7 is a timing chart when a 512-bit parallel test is performed on a semiconductor memory device having an 8-bank structure according to the related art.

DETAILED DESCRIPTION OF THE PREFERRED EMBODIMENTS

Before describing the present invention, the related art will be explained in detail with reference to FIGS. 6 and 7, in order to facilitate the understanding of the present invention.

In the DRAM, a data bus RWBUS is provided for each bank. Data is transferred through the data bus RWBUS between a memory cell array and a peripheral circuit. The bank is a unit that includes, for example, an address decoder (an X decoder and a Y decoder), a memory cell array, a sense amplifier, and a main amplifier. The bank is independently controlled by a command that is supplied from the outside. A plurality of main amplifiers is connected to the data bus RWBUS and supplies data to the memory cells through a main IO line, a local IO line, the sense amplifier, and a bit line.

During a read operation of the parallel test, some or all of the banks are activated at the same time, and a large amount of data is simultaneously output from a plurality of memory cells and supplied to a plurality of main IO lines in each bank. The main amplifier amplifies the data, and a compression circuit compresses the amplified data and supplies the compressed data to an output buffer unit through the data bus RWBUS.

Figure 6:
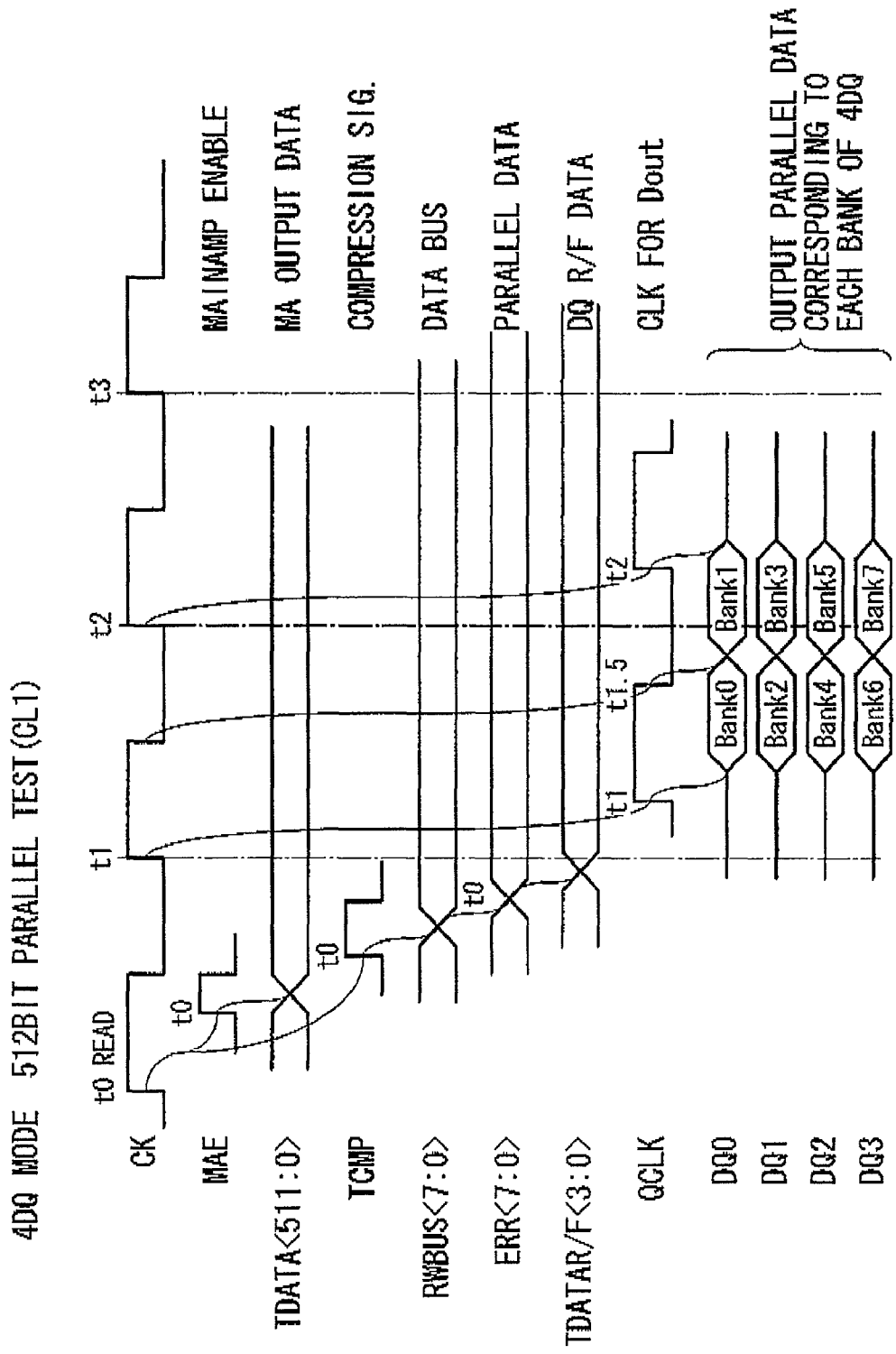
FIG. 6 is a timing chart when a 512-bit parallel test is performed on a semiconductor memory device having an 8-bank structure according to the related art.

FIG. 6 is a timing chart when a 512-bit parallel test is performed on a semiconductor memory device having an 8-bank structure according to the related art. FIG. 6 shows an operation when CL (/CAS latency: the number of clocks after a READ command is input)=1 and BL (burst length: the number of continuous output data)=2. When the READ command is input at a time t0, the compression circuit compresses a main amplifier output signal TDATA into one bit in response to a compression control signal TCMP and supplies the compression result to the output buffer unit through the data bus RWBUS in each bank. The output buffer circuit supplies an output signal TDATAR/F corresponding to the compression result to output terminals DQ0 to DQ3 in response to an output buffer control signal QCLK. The output buffer control signal QCLK allows data of an output signal TDATAR to be output in synchronization with the first rising edge (time t1) of an external clock signal CK after the READ command is input and allows data of an output signal TDATAF to be output in synchronization with the first falling edge of the external clock signal CK.

Therefore, when the next READ command is input at a time t1, it is necessary to repeatedly perform the above-mentioned operation on another memory cell and output data during the period from the time t1 to a time t2, which is the next period of the external clock signal CK.

In the semiconductor memory device of the related art, the parallel test is performed when CL=1 wherein a circuit is controlled by the control signals synchronized with the first rising edge and the first falling edge of the external clock signal CK after the READ command is input. Thus, the clock cycle is limited by tAA, or the time from the acquisition of a Y address by the READ command to the output of data from the data output terminal. Therefore, it is difficult to reduce the clock cycle and thus reduce the parallel test time.

FIG. 7 is a timing chart when a 512-bit parallel test is performed on a semiconductor memory device having an 8-bank structure according to the related art. FIG. 7 shows an operation when CL=1 and BL=4. FIG. 7 is different from FIG. 6 in that the number of output terminals that output the compression result is half that in the structure shown in FIG. 6 in order to double the number of semiconductor memory devices that can be measured at the same time and the output buffer serially outputs 4-bit data. Therefore, the compressed data of eight banks is divided into data of the four banks of the first half and data of the four banks of the second half. The divided sets of data are output. The division is made by a 2DQ control signal TDQF and an output buffer control signal QCLK. The 2DQ control signal TDQF and the output buffer control signal QCLK are synchronized with the first falling edge (t0.5) of the external clock signal CK and the second falling edge (t1.5) of the external clock signal CK, respectively. The, the divided sets of data are output.

Therefore, when the number of output test terminals is reduced and the output of the output buffer circuit is changed from four outputs to two outputs, it is possible to increase the number of chips that can be measured simultaneously. However, the number of clocks required to output data is increased. Similar to when four data are output, the clock cycle is limited by tAA.

While the burst length is increased, the number of clocks is increased, the clock cycle is not reduced. Therefore, it is difficult to reduce the parallel test time.

The invention will be now described herein with reference to illustrative embodiments. Those skilled in the art will recognize that many alternative embodiments can be accomplished using the teaching of the present invention and that the invention is not limited to the embodiments illustrated for explanatory purpose.

In one embodiment, a semiconductor device may include, but is not limited to, a data compression circuit that performs sequential processes based on timings of an external clock signal. The sequential processes may include, but is not limited to, compressing data input in parallel, latching the compressed data, and outputting the latched data. The clock cycle can be shortened by the time period which is defined from latching data to outputting data. This will reduce the parallel test time.

The data compression circuit may perform compressing the data in synchronization with an n-th transition of the external clock signal, latching the compressed data in synchronization with an (n+1)-th transition of the external clock signal, and outputting the latched data in synchronization with an (n+2)-th transition of the external clock signal. The clock cycle can be shortened by the time period which is defined from latching data to outputting data. This will reduce the parallel test time.

The data compression circuit may include, but is not limited to, a first compression circuit that compresses data in synchronization with an n-th transition of the external clock signal. The latch circuit receives first compressed data from the first compression circuit. The latch circuit latches the first compressed data in synchronization with an (n+1)-th transition of the external clock signal. The output buffer circuit receives the first latched data from the latch circuit. The output buffer circuit outputs the latched data in synchronization with an (n+2)-th transition of the external clock signal. The clock cycle can be shortened by the time period which is defined from latching data by the latch circuit to outputting data from the output buffer circuit. This will reduce the parallel test time.

The data compression circuit may include, but is not limited to, a second compression circuit that compresses data in synchronization with the n-th transition of the external clock signal. The latch circuit receives second compressed data from the second compression circuit. The latch circuit latches the second compressed data in synchronization with the (n+1)-th transition of the external clock signal.

The data compression circuit may include, but is not limited to, an output buffer control circuit coupled between the latch circuit and the output buffer circuit. The output buffer control circuit receives first latched data and second latched data from the latch circuit. The output buffer control circuit sequentially selects the first latched data and the second latched data based on timings of the external clock signal. In this way, it is possible that a series of operations is performed in an external-clock-input time period, and an output buffer circuit control operation is performed in a different external-clock-input time period. This will reduce the parallel test time. The output buffer control circuit generates an output buffer control circuit which is synchronized with the (n+2)-th transition of the external clock signal.

The data compression circuit may further include a clock control circuit that controls the output buffer control circuit. The latch circuit, the output buffer control circuit, and the clock control circuit are disposed adjacent to the output buffer circuit.

The data compression circuit may further include a data bus coupling the first compression circuit and the latch circuit. The data bus transfers the first compressed data from the first compression circuit to the latch circuit.

The semiconductor device may further include, but is not limited to, a plurality of memory cells. The data compression circuit may include, but is not limited to, a first compression circuit that compresses data in synchronization with an n-th transition of the external clock signal. The data have been read out of the plurality of memory cells. The data compression circuit may include, but is not limited to, a latch circuit that receives first compressed data from the first compression circuit. The latch circuit latches the first compressed data in synchronization with an (n+1)-th transition of the external clock signal. The data compression circuit may include, but is not limited to, an output buffer circuit that receives first latched data from the latch circuit. The output buffer circuit outputs the first latched data in synchronization with an (n+2)-th transition of the external clock signal.

The semiconductor device may further include, but is not limited to, a plurality of memory cells. The data compression circuit may include, but is not limited to, a plurality of compression circuits that each compresses data in synchronization with an n-th transition of the external clock signal. The data have been read out of the plurality of memory cells. The data compression circuit may include, but is not limited to, a latch circuit coupled to the plurality of compression circuits. The latch circuit receives compressed data from each of the plurality of compression circuits. The latch circuit latches the compressed data in synchronization with an (n+1)-th transition of the external clock signal. The data compression circuit may include, but is not limited to, an output buffer circuit that receives the latched data from the latch circuit. The output buffer circuit outputs the latched data in synchronization with an (n+2)-th transition of the external clock signal.

The n-th transition, the (n+1)-th transition, and the (n+2)-th transition are the same type transition, for example, rising edge or falling edge of the external clock signal.

In another embodiment, a semiconductor device may include, but is not limited to, a plurality of memory cells, a first compression circuit, a latch circuit, and an output buffer circuit. The first compression circuit receives a plurality of data that are input in parallel from the plurality of memory cells. The first compression circuit compresses data in synchronization with a first transition of an external clock signal. The data have been read out of the plurality of memory cells. The latch circuit receives the first compressed data from the first compression circuit. The latch circuit latches the first compressed data based on a first control signal. The first control signal is synchronized with a second transition of the external clock signal. The output buffer circuit receives first latched data from the latch circuit. The output buffer circuit outputs the first latched data based on a second control signal. The second control signal is synchronized with a third transition of the external clock signal. The clock cycle can be shortened by the time period which is defined from latching data to outputting data. This will reduce the parallel test time.

The data compression circuit may further include a second compression circuit that compresses data in synchronization with the first transition of the external clock signal. The latch circuit receives second compressed data from the second compression circuit. The latch circuit latches the second compressed data based on the first control signal which is synchronized with the second transition of the external clock signal.

The data compression circuit may further include an output buffer control circuit coupled between the latch circuit and the output buffer circuit. The output buffer control circuit receives first latched data and second latched data from the latch circuit. The output buffer control circuit sequentially selects the first latched data and the second latched data based on timings of the external clock signal.

In still another embodiment, a circuit may include, but is not limited to, a first compression circuit, a latch circuit, and an output buffer circuit. The first compression circuit compresses data in synchronization with a first transition of an external clock signal. The latch circuit receives first compressed data from the first compression circuit. The latch circuit latches the first compressed data in synchronization with a second transition of the external clock signal. The output buffer circuit receives the first latched data from the latch circuit. The output buffer circuit outputs the latched data in synchronization with a third transition of the external clock signal. The circuit may further include, but is not limited to, a second compression circuit that compresses data in synchronization with the first transition of the external clock signal. The latch circuit receives second compressed data from the second compression circuit, the latch circuit latching the second compressed data in synchronization with the second transition of the external clock signal. The circuit may further include, but is not limited to, an output buffer control circuit coupled between the latch circuit and the output buffer circuit. The output buffer control circuit receives first latched data and second latched data from the latch circuit. The output buffer control circuit sequentially selects the first latched data and the second latched data based on timings of the external clock signal. The output buffer control circuit generates an output buffer control circuit which is synchronized with the third transition of the external clock signal. The circuit may further include, but is not limited to, a clock control circuit that controls the output buffer control circuit. The latch circuit, the output buffer control circuit, and the clock control circuit are disposed adjacent to the output buffer circuit. The first transition, the second transition, and the third transition may be the same type transition. The clock cycle can be shortened by the time period which is defined from latching data to outputting data. This will reduce the parallel test time.

First Embodiment

Figure 1:
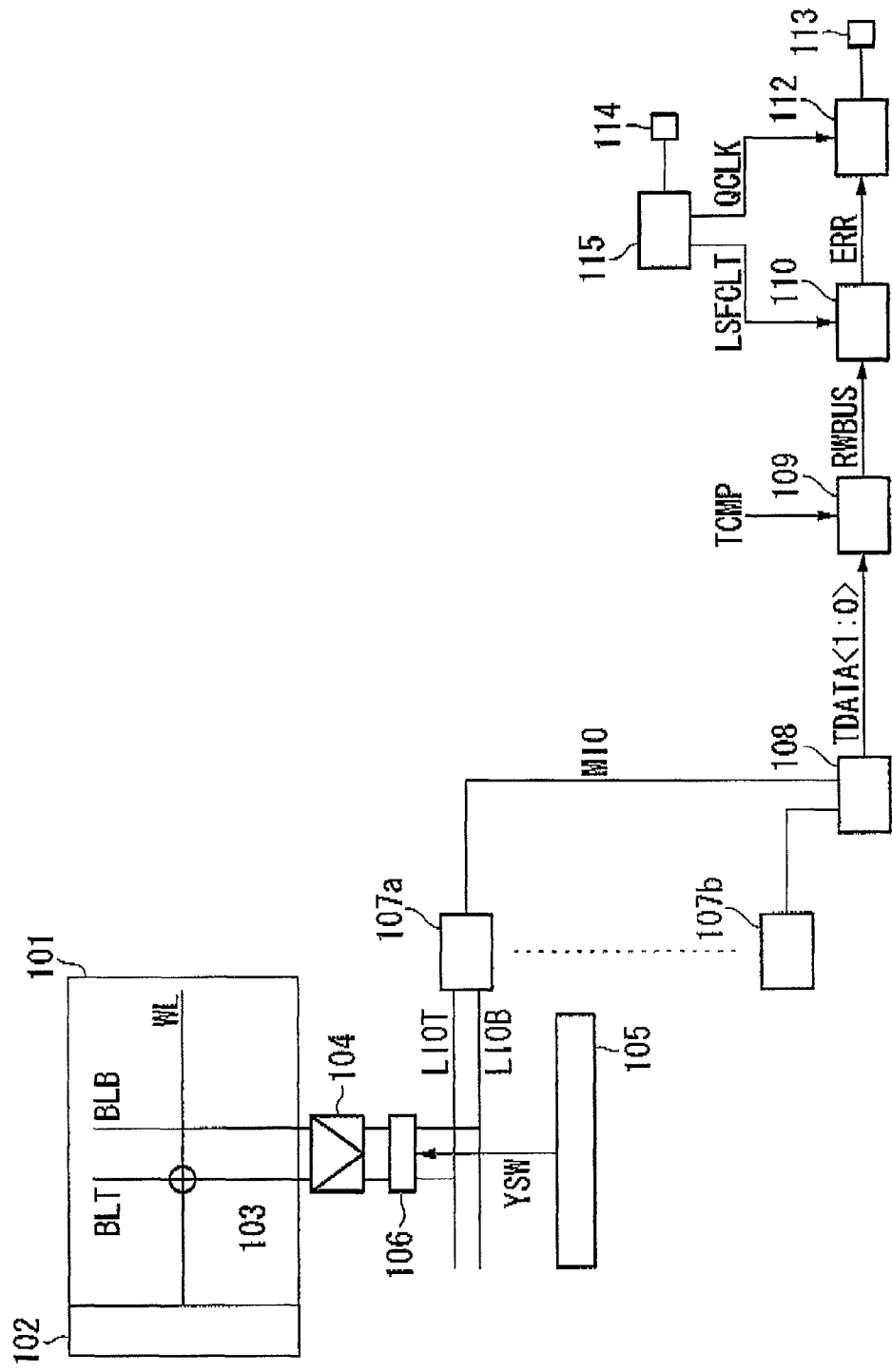
FIG. 1 is a block diagram illustrating a semiconductor memory device according to an embodiment of the invention.
Figure 2:
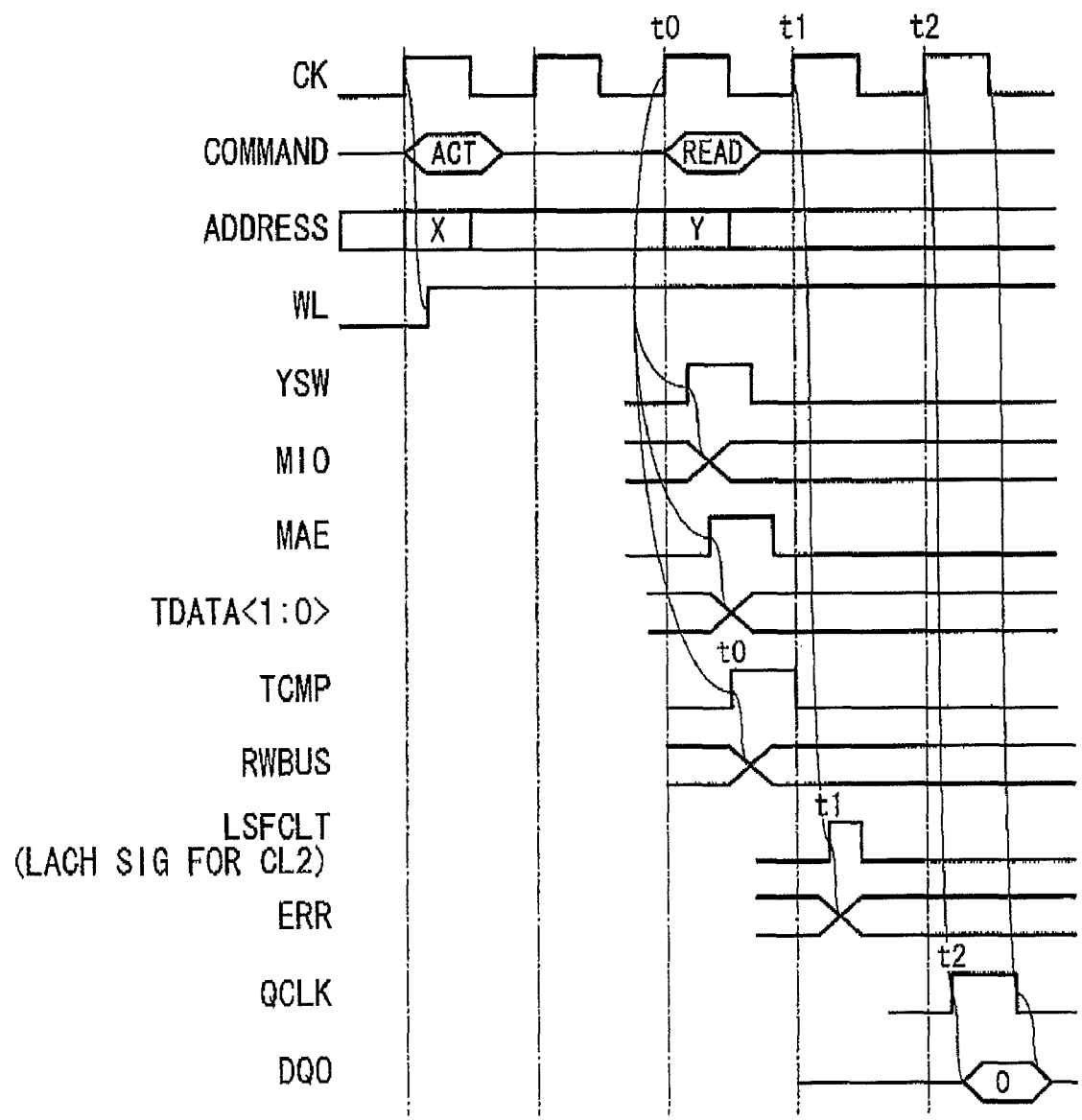
FIG. 2 is a timing chart illustrating the operation of the main signals shown in FIG. 1.

FIG. 1 is a block diagram illustrating a semiconductor memory device according to an embodiment of the invention. FIG. 2 is a timing chart illustrating the operation of the main signals shown in FIG. 1.

In FIG. 2, an external clock signal CK is continuously input to an external clock terminal 114 in time series. In the following description, an external clock signal in which a READ command is input is referred to as a first external clock cycle, followed by a second external cycle and a third external clock cycle. In addition, a line connecting between the waveforms of the main signals indicates the relationship in synchronization between the signals. For example, a latch circuit control signal LSFCLT is generated in synchronization with the second rising edge (time t1) of the external clock signal CK. A latch circuit output signal ERR is generated in synchronization with the rising edge of the latch circuit control signal LSFCLT.

The embodiment of the invention will be described with reference to FIGS. 1 and 2.

FIG. 1 shows circuit configurations which are related to read operations, but does not show circuit configurations related to a write operation. FIG. 1 schematically illustrates the read operation when an output terminal 113 is a single terminal. In many cases, a DRAM has a plurality of banks. However, in this embodiment, it is assumed for simplify the descriptions that the DRAM has single bank.

In FIG. 1, a memory cell array 101 may include, but is not limited to, a plurality of memory cells 103 provided at intersections of a word line WL selected by an X decoder 102 and a pair of bit lines (BLT, BLB). The pair of bit lines (BLT, BLB) is connected to a sense amplifier 104. In FIG. 2, when an ACT command is input to the semiconductor memory device, an X address for selecting the X decoder is acquired, and a word line WL corresponding to the X address is changed to a high level. The memory cell 103 connected to the word line WL is selected and data is read from the memory cells. Then, a potential difference occurs between the pair of bit lines (BLT, BLB), and the sense amplifier 104 performs amplification. Then, in FIG. 2, when the READ command is input at a time t0, a Y address for selecting a Y decoder is acquired, and the Y decoder 105 selects a Y switching signal YSW corresponding to the Y address. Then, a Y switch 106 is opened by the Y switching signal YSW, and the pair of bit lines (BLT, BLB) and a pair of local IO lines (LIOT, LIOB) are connected to each other.

In FIG. 1, the pair of local IO lines (LIOT, LIOB) is connected to a main, IO line MIO through a sub-amplifier 107a. In addition, a pair of local IO lines (not shown) provided so as to correspond to another memory cell array is also connected to another main IO line through a sub-amplifier 107b.

A main amplifier 108 is activated by a main amplifier activation signal MAE. During a normal operation, the main amplifier 108 selectively outputs data of the main IO line corresponding to a Y address input from the outside among a plurality of main IO lines as a main amplifier output signal TDATA. Meanwhile, in a parallel test, the main amplifier 108 receives data from a plurality of cell arrays and outputs the received data as a main amplifier output signal TDATA<i>. In this embodiment, two main IO lines are provided and a main amplifier output signal TDATA<2> corresponding to 2 bits is output.

Subsequently, a compression circuit 109, which is provided in the vicinity of the cell arrays and the main amplifier, receives a 2-bit main amplifier output signal TDATA<2> in response to a compression control signal TCMP. The compression circuit 109 outputs the compression result to a data bus RWBUS. In FIG. 2, the compression control signal TOP is generated in synchronization with the first rising edge (time t0) of the external clock signal. During normal operations, it is not necessary to perform the compression process, and the main amplifier output signal TDATA is output to the data bus RWBUS without any change.

In FIG. 1, the signal is input to a latch circuit 110 through the data bus RWBUS. The latch circuit 110 receives data from the data bus RWBUS in response to a latch circuit control signal LSFCLT. The latch circuit 110 holds the output potential of the latch circuit output signal ERR until the latch circuit control signal LSFCLT is generated. The latch circuit control signal LSFCLT is generated by a CL control circuit 115, which will be described below, in synchronization with the second rising edge (time t1) of the external clock signal.

In FIG. 1, an output buffer circuit 112 receives a latch circuit output signal ERR and outputs the compression result to an output terminal 113 in response to an output buffer control signal QCLK.

The output buffer control signal QCLK is generated by the CL control circuit 115, which will be described below, in synchronization with the third rising edge (time t2) of the external clock signal.

In FIG. 1, the CL control circuit 115 is disposed adjacent to the latch circuit 110 and the output buffer circuit 112 on the chip. The CL control circuit 115 receives the external clock signal CK from an external clock terminal 114. The CL control circuit 115 generates a control signal in synchronization with the rising edge or the falling edge of the external clock signal using a DLL circuit provided therein.

As shown in FIG. 2, the CL control circuit 115 generates the latch circuit control signal LSFCLT in synchronization with the second rising edge at a time t1 of the external clock signal. The CL control circuit 115 generates the output buffer control signal QCLK in synchronization with the third rising edge at a time t2 of the external clock signal.

The semiconductor memory device according to this embodiment may include, but is not limited to, a data compression circuit that sequentially performs a compressing process and an outputting process. In the compressing process, the data compression circuit compresses a plurality of data such as main amplifier output signals TDATA that is input in parallel, a process of latching the compressed data. In the outputting process, the data compression circuit outputs the latched data such as a latch circuit output signal ERR to the output terminal such as an output terminal 113. The data compression circuit sequentially performs the compressing process and the outputting process in synchronization with the external clock such as an external clock signal CK. The external clock is continuously input in time series to the external clock terminal, for example, external clock terminal 114.

The semiconductor memory device according to this embodiment may include, but is not limited to, a plurality of memory cells. The data compression circuit of the semiconductor memory device may include, but is not limited to a compression circuit such as a compression circuit 109. The compression circuit 109 compresses data that has been read out of the plurality of memory cells in synchronization with, at a time t0, an n-th (n=1) external clock signal such as an external clock signal CK. The external clock signal CK is input from the external clock terminal such as an external clock terminal 114. The data compression circuit of the semiconductor memory device may include, but is not limited to, a data bus such as a data bus RWBUS. The data bus RWBUS transmits the compressed data from the compression circuit such as a compression circuit 109. The data compression circuit of the semiconductor memory device may include, but is not limited to, a circuit such as a latch circuit 110. The latch circuit 110 is connected to the data bus such as a data bus RWBUS. The latch circuit 110 latches the compressed data in synchronization with an (n+1)-th (n=1) external clock signal. The data compression circuit of the semiconductor memory device may include, but is not limited to, an output buffer circuit. The output buffer circuit supplies latch data such as latch circuit output signal ERR from the latch circuit such as a latch circuit 110 to an output terminal such as an output terminal 113 in synchronization with an (n+2)-th (n=1) external clock signal.

In this way, it is possible that the above series of operations is performed in an external-clock-input time period, and an output buffer circuit control operation is performed in a different external-clock-input time period. The above series of operations include switching of Y address to outputting data from the compression circuit such as the compression circuit 109 to the data bus such as the data bus RWBUS.

The clock cycle can be shortened by the time period which is defined from latching data by the latch circuit such as the latch circuit 110 to outputting data from the output buffer circuit such as the output buffer circuit 112. This will reduce the parallel test time.

The CL control circuit 115 can be arranged adjacent to the latch circuit 110 and the output buffer circuit 112. Further, the CL control circuit 115 can generate the latch circuit control signal LSFCLT and the output buffer control signal QCLK. These configurations reduce the load to the control signal. Therefore, it is possible to reduce the clock cycle.

In this embodiment, the semiconductor memory device with a single bank has been described as one example. However, the above-described configurations may be applied to a semiconductor memory device with a plurality of banks. In this case of the plurality of banks, it is also possible to obtain the same effects as described above. For example, in a semiconductor memory device including two banks, the compression circuit may read data from the cells in each bank. The compression circuit compresses the read data. The compression circuit outputs the compressed data to the data bus RWBUS. The latch circuit 110 may latch data corresponding to two banks. The output buffer circuit may output the compressed data corresponding to one bank at the rising edge of the output buffer control signal QCLK and output the compressed data corresponding to the other bank at the falling edge of the output buffer control signal QCLK.

Second Embodiment

Figure 3:
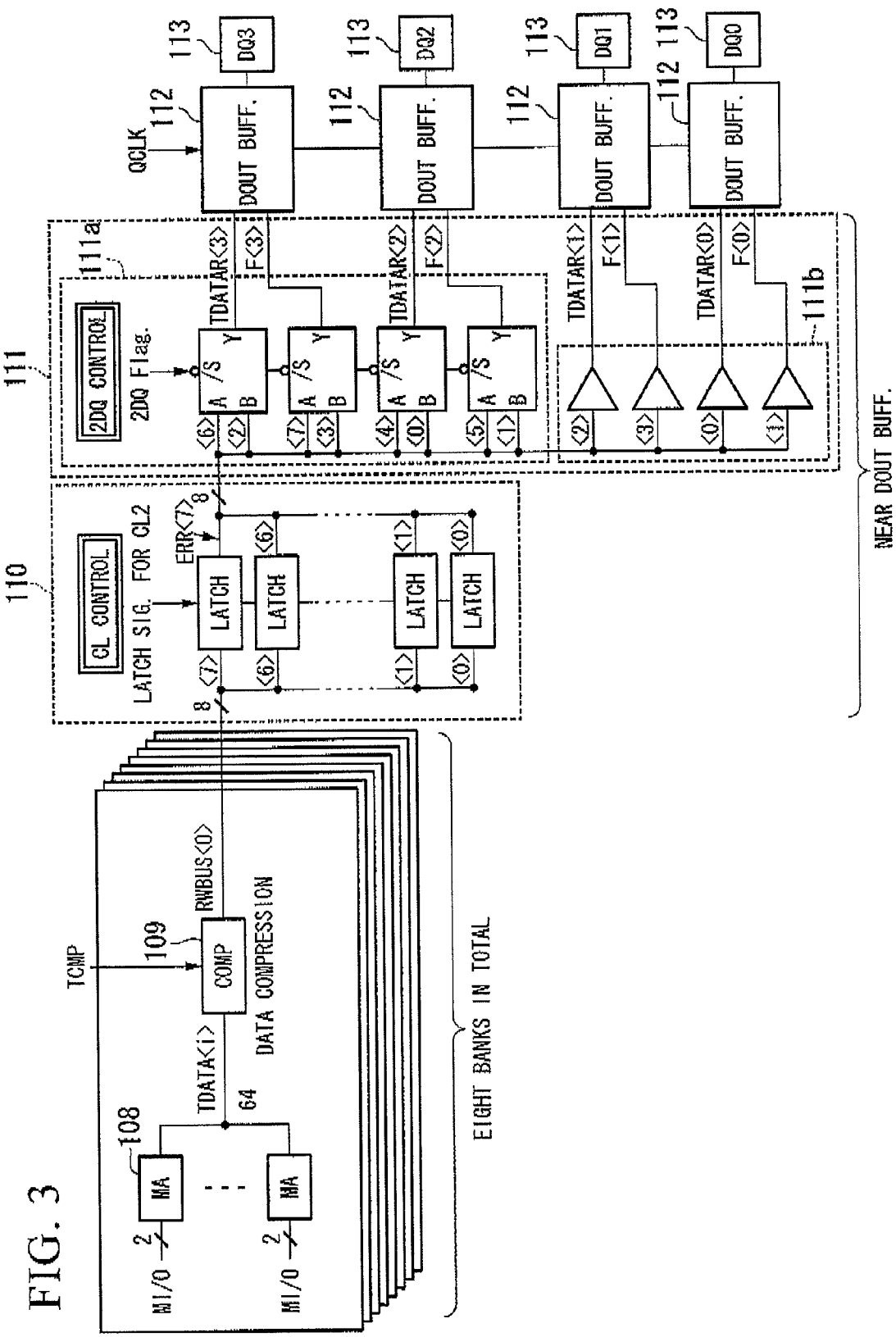
FIG. 3 is a block diagram illustrating a semiconductor memory device which includes eight banks 0 to 7 each having thirty-two memory cell arrays.

In this embodiment, a semiconductor memory device including a 512-bit parallel test circuit shown in FIG. 3 will be described. In FIG. 3, only the main components related to a read operation are shown in order to describe data output. The read operation is after data in the memory cells are output to the main IO.

In FIG. 3, the semiconductor memory device according to this embodiment includes eight banks 0 to 7 each having thirty-two memory cell arrays. In addition, two main IO lines (M/IO) are provided in each memory cell array. That is, data corresponding to 2 bits is output from each memory cell array to the main IO line (MI/O), and 64-bit data is input to the compression circuit.

A compression circuit 109 is provided in each of the banks. The compression circuit 109 compresses data and transmits the compressed data to a latch circuit 110 through a data bus RWBUS.

Therefore, in a parallel test for the semiconductor memory device according to this embodiment, 512 bits in total for eight banks are tested.

An output buffer circuit 112 outputs the test results of the eight banks to four output terminals DQ0 to DQ3. The output buffer circuit 112 can be responsible for a mode such as a 4DQ mode. In the 4DQ mode, four output buffer circuits are used to perform data output in response to a 2DQ control signal TDQF and a mode (2DQ mode) in which two output buffer circuits are used to perform data output.

Figure 4:
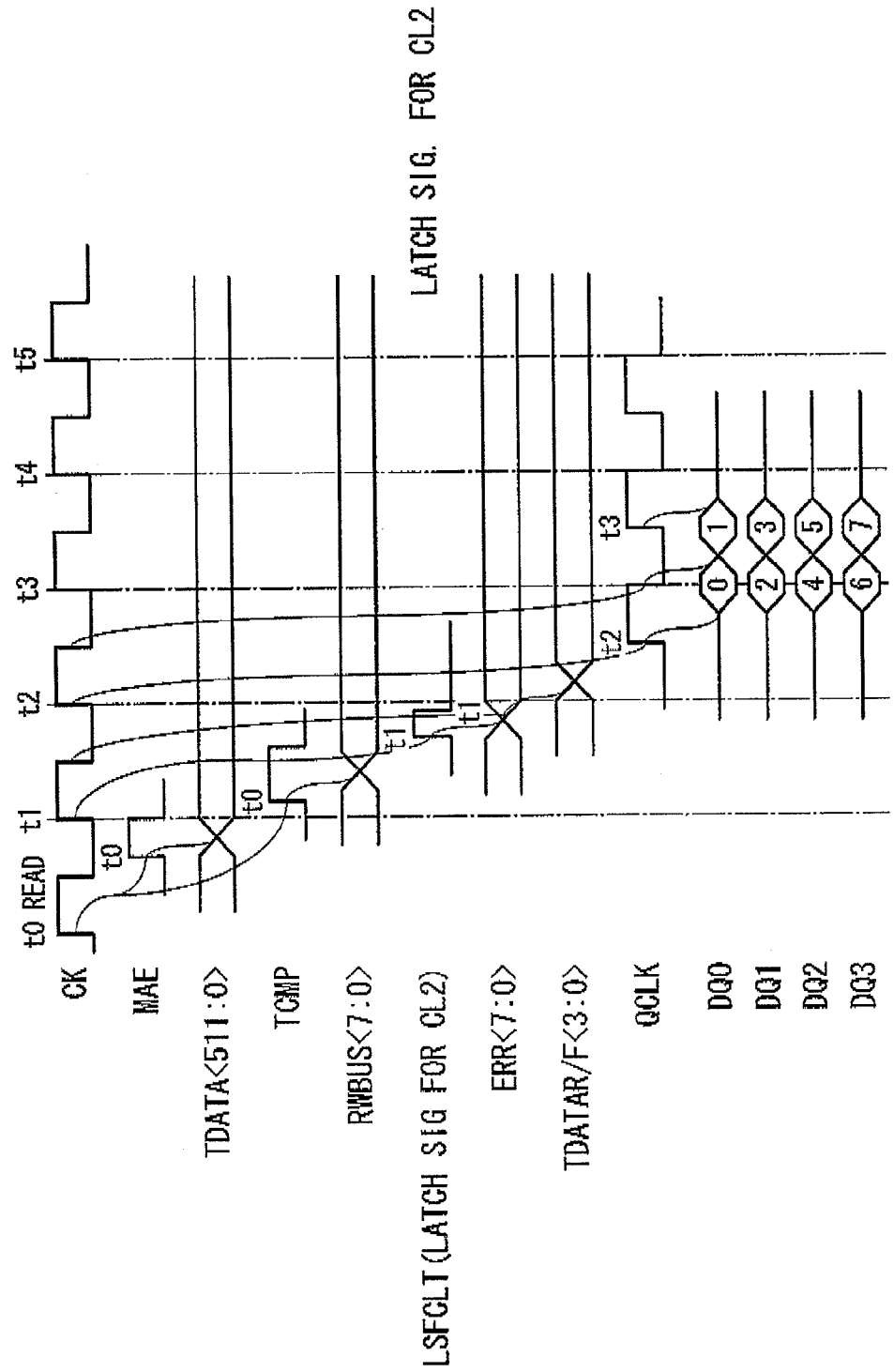
FIG. 4 is a diagram illustrating the operation timings of the main signals of the semiconductor memory device shown in FIG. 3 in the 4DQ mode.
Figure 5:
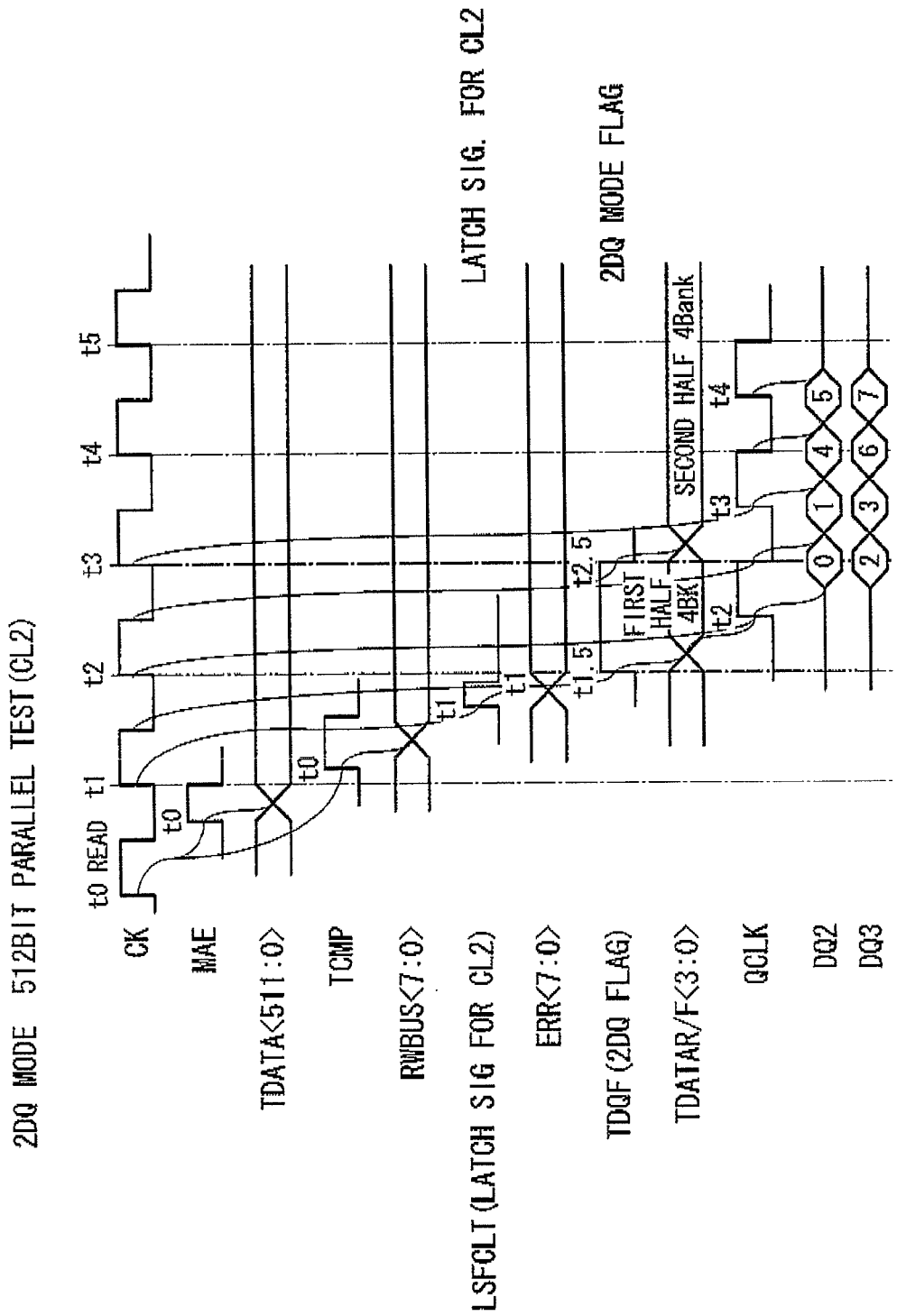
FIG. 5 is a diagram illustrating the operation timings of the main signals of the semiconductor memory device shown in FIG. 3 in the 2DQ mode.

FIG. 4 is a diagram illustrating the operation timings of the main signals of the semiconductor memory device shown in FIG. 3 in the 4DQ mode. FIG. 5 is a diagram illustrating the operation timings of the main signals of the semiconductor memory device shown in FIG. 3 in the 2DQ mode.

This second embodiment will be described with reference to FIGS. 3, 4, and 5.

In FIGS. 4 and 5, an external clock signal CK is continuously input to an external clock terminal (not shown) in time series. In the following description, an external clock signal in which a READ command is input is referred to as a first external clock cycle, followed by a second external clock cycle, a third external clock cycle, and a fourth external clock cycle. In addition, the first to fourth rising edges of the external clock signal are referred to as a time t0, a time t1, a time t2, and a time t3.

At the time t0, the READ command is input, and a Y address is acquired. A main amplifier MA 108 supplies data, which has been read from a memory cell corresponding to the acquired Y address, to the compression circuit 109. The data is supplied in response to a main amplifier activation signal MAE synchronized with the first rising edge of the external clock signal. The compression circuit 109 in each bank receives a 64-bit main amplifier output signal TDATA<i> (i=0 to 63) from thirty-two main amplifiers 108. The compression circuit 109 receives a 2-bit main amplifier output signal from each of the thirty-two main amplifiers 108. In FIGS. 4 and 5, the timing of the main amplifier output signal TDATA<511:0> is shown. Here, <511:0> indicates the timing of data corresponding to 512 bits of the eight banks.

The compression circuit 109 in each bank compresses the main amplifier output signal TDATA<i> in response to a compression control signal TCMP. The compression control signal TCMP is synchronized with the first rising edge (time t0) of the external clock signal. The compression circuit 109 in each bank outputs the compression result to the data bus RWBUS<i> (i=0 to 7). In the data bus RWBUS<i>, <i> indicates the bank number. In this embodiment, eight data buses (i=0 to 7) are provided.

A latch circuit 110 is controlled by a latch circuit control signal LSFCLT. The latch circuit 110 acquires data from the data bus RWBUS<i> as an 8-bit input signal. The latch circuit 110 outputs a latch circuit output signal ERR<i>. The compression result of a bank i is supplied as the latch circuit output signal ERR<i> to an output buffer control circuit 111 in the next stage. The latch circuit 110 includes eight latch units, such as flip-flops, having a function of holding data. The latch circuit 110 latches the latch circuit output signal ERR<7:0>, which is 8-bit data, until the next latch circuit control signal LSFCLT is input. The latch circuit control signal LSFCLT is generated by a CL control circuit 115, which will be described below. The CL control circuit 115 is synchronized with the second rising edge (time t1) of the external clock signal.

In FIG. 3, the output buffer control circuit 111 receives the latch circuit output signal ERR<7:0>. The output buffer control circuit 111 generates an output signal TDATAR/F<3:0>. The output buffer control circuit 111 includes circuits 111a and 111b. The circuit 111a performs 2DQ control. The circuit 111b transmits the latch circuit output signal ERR as a positive logic to the next stage.

When a 2DQ control signal TDQF (2DQ flag) is at a high level, the circuit 111a performing 2DQ control outputs data which has been input to B in FIG. 3. When the 2DQ control signal TDQF is in the low level, the circuit 111a outputs data which is input to A. That is, in FIG. 5, during the period for which the 2DQ control signal TDQF is at the high level, the compression results of the banks 0 to 3 are output, and then the compression results of the banks 4 to 7 are output. The circuit 111b outputs the compression results of the banks 0 to 3 regardless of the level of the 2DQ control signal TDQF.

Therefore, in the 4DQ mode shown in FIG. 4, the compression result of the bank 0 is output as an output signal TDATAR<0>. The compression result of the bank 1 is output as the output signal TDATAF<0>. The compression result of the bank 2 is output as an output signal TDATAR<1>. The compression result of the bank 3 is output as the output signal TDATAF<1>. The compression result of the bank 4 is output as an output signal TDATAR<2>. The compression result of the bank 5 is output as the output signal TDATAF<2>. The compression result of the bank 6 is output as an output signal TDATAR<3>. The compression result of the bank 7 is output as the output signal TDATAF<3>.

In the 2DQ mode shown in FIG. 5, the same compression result as that in the 4DQ mode is output as the output signal TDATAR/F<0> and the TDATAR/F<1>. The output signal TDATAR/F<2> and the TDATAR/F<3> are output depending on the state of the 2DQ control signal TDQF. When the 2DQ control signal TDQF is in the high level, the compression result of the bank 0 is output as the output signal TDATAR<2>. The compression result of the bank 1 is output as the output signal TDATAF<2>. The compression result of the bank 2 is output as the output signal TDATAR<3>. The compression result of the bank 3 is output as the output signal TDATAF<3>.

On the other hand, when the 2DQ control signal TDQF is in the low level, the compression result of the bank 4 is output as the output signal TDATAR<2>. The compression result of the bank 5 is output as the output signal TDATAF<2>. The compression result of the bank 6 is output as the output signal TDATAR<3>. The compression result of the bank 7 is output as the output signal TDATAF<3>.

Output buffer circuits 112 receive the output signal TDATAR/F<3:0> from the output buffer control circuit 111. The output buffer circuits 112 outputs data to the output terminals DQ0 to DQ3. The output buffer circuits 112 outputs in series the data of the output signal TDATAR<3:0> at the rising edges of the output buffer control signal QCLK. The output buffer circuits 112 outputs in series the data of the output signal TDATAF<3:0> at the falling edges of the output buffer control signal QCLK.

In the 4DQ mode shown in FIG. 4, the output buffer circuit 112 connected to the output terminal DQ0 outputs the compression result of the bank 0 in synchronization with the third rising edge (time t2) of the external clock signal. The output buffer circuit 112 outputs the compression result of the bank 1 in synchronization with the third falling edge (time t2.5) of the external clock signal. The output buffer circuit 112 connected to the output terminal DQ1 outputs the compression result of the bank 2 in synchronization with the third rising edge (time t2) of the external clock signal. The output buffer circuit 112 outputs the compression result of the bank 3 in synchronization with the third falling edge (time t2.5) of the external clock signal. The output buffer circuit 112 connected to the output terminal DQ2 outputs the compression result of the bank 4 in synchronization with the third rising edge (time t2) of the external clock signal. The output buffer circuit 112 outputs the compression result of the bank 5 in synchronization with the third falling edge (time t2.5) of the external clock signal. The output buffer circuit 112 connected to the output terminal DQ3 outputs the compression result of the bank 6 in synchronization with the third rising edge (time t2) of the external clock signal. The output buffer circuit 112 outputs the compression result of the bank 7 in synchronization with the third falling edge (time t2.5) of the external clock signal.

In the 2DQ mode shown in FIG. 5, the output buffer circuit 112 connected to the output terminal DQ2 outputs the compression result of the bank 0 in synchronization with the third rising edge (time t2) of the external clock signal. The output buffer circuit 112 outputs the compression result of the bank 1 in synchronization with the third falling edge (time t2.5) of the external clock signal. In addition, the output buffer circuit 112 connected to the output terminal DQ2 outputs the compression result of the bank 4 in synchronization with the fourth rising edge (time t3) of the external clock signal. The output buffer circuit 112 outputs the compression result of the bank 5 in synchronization with the fourth falling edge (time t3.5) of the external clock signal. Similarly, the output buffer circuit 112 connected to the output terminal DQ3 outputs the compression results of the banks 2, 3, 6, and 7 in synchronization with the rising edge (time t2) and the third falling edge (time t2.5) of the external clock signal and the rising edge (time t3) and the fourth falling edge (time t3.5) of the external clock signal.

In FIG. 3, a CL control circuit generates the signal latch circuit control signal LSFCLT, the 2DQ control signal TDQF, and the output buffer control signal QCLK in synchronization with the rising edge of the external clock signal CK. The CL control circuit corresponds to the CL control circuit 115 in FIG. 1. The CL control circuit 115 is arranged adjacent to the latch circuit 110, the output buffer control circuit 111, and the output buffer circuit 112 on the chip. The CL control circuit 115 receives the external clock signal CK from an external clock terminal which corresponds to the external clock terminal 114 in FIG. 1. The CL control circuit 115 outputs control signals using, for example, a DLL circuit.

As shown in FIGS. 4 and 5, the latch circuit control signal LSFCLT is synchronized with the second rising edge (time t1) of the external clock signal. In the 2DQ mode, the 2DQ control signal TDQF has a rising edge that is synchronized with the second falling edge (time t1.5) of the external clock signal. The 2DQ control signal TDQF has a falling edge that is synchronized with the third falling edge (time t2.5) of the external clock signal. The output buffer control signal QCLK has a rising edge that is synchronized with the third and fourth rising edges (times t2 and t3) of the external clock signal. The output buffer control signal QCLK has a falling edge that is synchronized with the third and fourth falling edges (times t2.5 and t3.5) of the external clock signal.

The semiconductor memory device according to this embodiment may include, but is not limited to, a plurality of compression circuits, for example, compression circuits 109. The latch circuit such as the latch circuit 110 latches the compressed data (ERR0 to ERR7) of the compression circuits such as the compression circuits 109. The semiconductor memory device according to this embodiment may include, but is not limited to, an output buffer control circuit such as the output buffer control circuit 111. The output buffer control circuit 111 is connected between the latch circuit such as the latch circuit 110 and the output buffer circuit such as the output buffer circuit 112. The output buffer control circuit 111 sequentially selects the latch data (ERR0 to ERR7) of the latch circuit (latch circuit 110) in synchronization with the external clock signal. The output buffer control circuit 111 supplies the selected data to the output buffer circuits such as the output buffer circuits 112. The output buffer circuits such as the output buffer circuits 112 receive the output such as the output signal TDATAR/F<3:0> of the output buffer control circuit such as the output buffer control circuit 111. The output buffer circuits 112 sequentially outputs the received signals to the output terminals such as the output terminals 113 in synchronization with the external clock signal.

In this way, in the 2DQ mode, even when the burst length is increased and the number of clocks is increased, it is possible that the above-described first series of operations is performed in an external-clock-input time period, and the above-described second series of operations is performed in a different external-clock-input time period. The first series of operations includes switching the Y address to outputting the compressed data to the data bus RWBUS. The above-described second series of operations include inputting the compressed data to the latch circuit and outputting the compression result from the output buffer circuit to the output terminal.

The main amplifier can output the data of a separate main IO line to the compression circuit at the same time as the latch circuit completes its operation, and the compression circuit 109 can output data to the data bus RWBUS.

Therefore, it is possible to reduce the clock cycle by the time period which is defined from inputting the compressed data to the latch circuit to outputting the compression result from the output buffer circuit to the output terminal. Even when the number of clocks is increased, it is possible to reduce the parallel test time.

The CL control circuit 115 is arranged adjacent to the latch circuit 110, the output buffer control circuit 111, and the output buffer circuit 112. The CL control circuit 115 performs CL control on the latch circuit, the output buffer control circuit 111, and the output buffer circuit. These configurations reduce the load of the signal used for the CL control. Any variation in operation start time due to a control signal delay is not caused in a plurality of output buffer circuits.

Therefore, it is possible to further reduce the clock cycle and thus reduce the parallel test time.

It is apparent that the present invention is not limited to the above embodiments, but may be modified and changed without departing from the scope and spirit of the invention.

What is claimed is:

1. A semiconductor device comprising:
a data compression circuit that performs sequential processes based on timings of an external clock signal, the sequential processes including compressing data input in parallel, latching the compressed data, and outputting the latched data.

2. The semiconductor device according to claim 1, wherein the data compression circuit performs compressing the data in synchronization with an n-th transition of the external clock signal, latching the compressed data in synchronization with an (n+1)-th transition of the external clock signal, and outputting the latched data in synchronization with an (n+2)-th transition of the external clock signal.

3. The semiconductor device according to claim 1, wherein the data compression circuit comprises:
a first compression circuit that compresses data in synchronization with an n-th transition of the external clock signal;
a latch circuit that receives first compressed data from the first compression circuit, the latch circuit latching the first compressed data in synchronization with an (n+1)-th transition of the external clock signal; and
an output buffer circuit that receives the first latched data from the latch circuit, the output buffer circuit outputting the latched data in synchronization with an (n+2)-th transition of the external clock signal.

4. The semiconductor device according to claim 3, wherein the data compression circuit further comprises:
a second compression circuit that compresses data in synchronization with the n-th transition of the external clock signal; and
wherein the latch circuit receives second compressed data from the second compression circuit, the latch circuit latching the second compressed data in synchronization with the (n+1)-th transition of the external clock signal.

5. A semiconductor device comprising:
a data compression circuit that performs sequential processes based on timings of an external clock signal, the sequential processes including compressing data input in parallel, latching the compressed data, and outputting the latched data,
wherein the data compression circuit comprises:
a first compression circuit that compresses data in synchronization with an n-th transition of the external clock signal;
a latch circuit that receives first compressed data from the first compression circuit, the latch circuit latching the first compressed data in synchronization with an (n+1)-th transition of the external clock signal;
an output buffer circuit that receives the first latched data from the latch circuit, the output buffer circuit outputting the latched data in synchronization with an n+2-th transition of the external clock signal;
a second compression circuit that compresses data in synchronization with the n-th transition of the external clock signal; and
an output buffer control circuit coupled between the latch circuit and the output buffer circuit, the output buffer control circuit receiving first latched data and second latched data from the latch circuit, the output buffer control circuit sequentially selecting the first latched data and the second latched data based on timings of the external clock signal, and
wherein the latch circuit receives second compressed data from the second compression circuit, the latch circuit latching the second compressed data in synchronization with the (n+1)-th transition of the external clock signal.

6. The semiconductor device according to claim 5, wherein the output buffer control circuit generates an output buffer control circuit which is synchronized with the (n+2)-th transition of the external clock signal.

7. The semiconductor device according to claim 5, wherein the data compression circuit further comprises:
a clock control circuit that controls the output buffer control circuit, and
wherein the latch circuit, the output buffer control circuit, and the clock control circuit are disposed adjacent to the output buffer circuit.

8. The semiconductor device according to claim 3, wherein the data compression circuit further comprises:
a data bus coupling the first compression circuit and the latch circuit, the data bus transferring the first compressed data from the first compression circuit to the latch circuit.

9. The semiconductor device according to claim 1, further comprising:
a plurality of memory cells, and
wherein the data compression circuit comprises:
a first compression circuit that compresses data in synchronization with an n-th transition of the external clock signal, the data having been read out of the plurality of memory cells;
a latch circuit that receives first compressed data from the first compression circuit, the latch circuit latching the first compressed data in synchronization with an (n+1)-th transition of the external clock signal; and
an output buffer circuit that receives first latched data from the latch circuit, the output buffer circuit outputting the first latched data in synchronization with an (n+2)-th transition of the external clock signal.

10. The semiconductor device according to claim 1, further comprising:
a plurality of memory cells, and
wherein the data compression circuit comprises:
a plurality of compression circuits that each compress data in synchronization with an n-th transition of the external clock signal, the data having been read out of the plurality of memory cells;
a latch circuit coupled to the plurality of compression circuits, the latch circuit receiving compressed data from each of the plurality of compression circuits, the latch circuit latching the compressed data in synchronization with an (n+1)-th transition of the external clock signal; and
an output buffer circuit that receives the latched data from the latch circuit, the output buffer circuit outputting the latched data in synchronization with an (n+2)-th transition of the external clock signal.

11. The semiconductor device according to claim 1, wherein the n-th transition, the (n+1)-th transition, and the (n+2)-th transition are the same type transition.

12. A semiconductor device comprising:
a plurality of memory cells;
a first compression circuit that receives a plurality of data that are input in parallel from the plurality of memory cells, the first compression circuit compressing data in synchronization with a first transition of an external clock signal, the data having been read out of the plurality of memory cells;

a latch circuit that receives the first compressed data from the first compression circuit, the latch circuit latching the first compressed data based on a first control signal, the first control signal being synchronized with a second transition of the external clock signal; and an output buffer circuit that receives first latched data from the latch circuit, the output buffer circuit outputting the first latched data based on a second control signal, the second control signal being synchronized with a third transition of the external clock signal.

13. The semiconductor device according to claim 12, further comprising:

a second compression circuit that compresses data in synchronization with the first transition of the external clock signal; and wherein the latch circuit receives second compressed data from the second compression circuit, the latch circuit latching the second compressed data based on the first control signal being synchronized with the second transition of the external clock signal.

14. A semiconductor device comprising:

a plurality of memory cells;

a first compression circuit that receives a plurality of data that are input in parallel from the plurality of memory cells, the first compression circuit compressing data in synchronization with a first transition of an external clock signal, the data having been read out of the plurality of memory cells;

a latch circuit that receives the first compressed data from the first compression circuit, the latch circuit latching the first compressed data based on a first control signal, the first control signal being synchronized with a second transition of the external clock signal; and an output buffer circuit that receives first latched data from the latch circuit, the output buffer circuit outputting the first latched data based on a second control signal, the second control signal being synchronized with a third transition of the external clock signal;

a second compression circuit that compresses data in synchronization with the first transition of the external clock signal; and an output buffer control circuit coupled between the latch circuit and the output buffer circuit, the output buffer control circuit receiving first latched data and second latched data from the latch circuit, the output buffer control circuit sequentially selecting the first latched data and the second latched data based on timings of the external clock signal;

wherein the latch circuit receives second compressed data from the second compression circuit, the latch circuit latching the second compressed data based on the first control signal being synchronized with the second transition of the external clock signal.

15. A circuit comprising:

a first compression circuit that compresses data in synchronization with a first transition of an external clock signal;

a latch circuit that receives first compressed data from the first compression circuit, the latch circuit latching the first compressed data in synchronization with an second transition of the external clock signal; and an output buffer circuit that receives the first latched data from the latch circuit, the output buffer circuit outputting the latched data in synchronization with a third transition of the external clock signal.

16. The circuit according to claim 15, further comprising:

a second compression circuit that compresses data in synchronization with the first transition of the external clock signal; and wherein the latch circuit that receives second compressed data from the second compression circuit, the latch circuit latching the second compressed data in synchronization with the second transition of the external clock signal.

17. A circuit comprising:

a first compression circuit that compresses data in synchronization with a first transition of an external clock signal;

a latch circuit that receives first compressed data from the first compression circuit, the latch circuit latching the first compressed data in synchronization with an second transition of the external clock signal;

an output buffer circuit that receives the first latched data from the latch circuit, the output buffer circuit outputting the latched data in synchronization with a third transition of the external clock signal;

a second compression circuit that compresses data in synchronization with the first transition of the external clock signal; and an output buffer control circuit coupled between the latch circuit and the output buffer circuit, the output buffer control circuit receiving first latched data and second latched data from the latch circuit, the output buffer control circuit sequentially selecting the first latched data and the second latched data based on timings of the external clock signal, wherein the latch circuit that receives second compressed data from the second compression circuit, the latch circuit latching the second compressed data in synchronization with the second transition of the external clock signal.

18. The circuit according to claim 17, wherein the output buffer control circuit generates an output buffer control circuit which is synchronized with the third transition of the external clock signal.

19. The circuit according to claim 17, further comprising:

a clock control circuit that controls the output buffer control circuit, and wherein the latch circuit, the output buffer control circuit, and the clock control circuit are disposed adjacent to the output buffer circuit.

20. The circuit according to claim 15, wherein the first transition, the second transition, and the third transition are the same type transition.

* * * * *